United States Patent
Park et al.

(10) Patent No.: US 11,581,269 B2
(45) Date of Patent: Feb. 14, 2023

(54) SEMICONDUCTOR THIN FILM STRUCTURES AND ELECTRONIC DEVICES INCLUDING THE SAME

(71) Applicant: Samsung Electronics Co., Ltd., Suwon-si (KR)

(72) Inventors: Younghwan Park, Seongnam-si (KR); Jongseob Kim, Seoul (KR); Joonyong Kim, Seoul (KR); Junhyuk Park, Pohang-si (KR); Dongchul Shin, Suwon-si (KR); Jaejoon Oh, Seongnam-si (KR); Soogine Chong, Seoul (KR); Sunkyu Hwang, Seoul (KR); Injun Hwang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 86 days.

(21) Appl. No.: 16/868,745

(22) Filed: May 7, 2020

(65) Prior Publication Data

US 2021/0118814 A1    Apr. 22, 2021

(30) Foreign Application Priority Data

Oct. 17, 2019    (KR) .................. 10-2019-0129326

(51) Int. Cl.
*H01L 23/00*    (2006.01)
*H01L 29/15*    (2006.01)
(Continued)

(52) U.S. Cl.
CPC .......... *H01L 23/562* (2013.01); *H01L 29/155* (2013.01); *H01L 29/2003* (2013.01); *H01L 29/205* (2013.01); *H01L 29/7786* (2013.01)

(58) Field of Classification Search
CPC . H01L 23/562; H01L 29/155; H01L 29/2003; H01L 29/205; H01L 29/7786
See application file for complete search history.

(56) References Cited

U.S. PATENT DOCUMENTS 7,462,876 B2 * 12/2008 Han .................. H01L 33/04
257/97
7,888,670 B2 * 2/2011 Han .................. H01L 33/06
257/97
(Continued)

FOREIGN PATENT DOCUMENTS

CN    103296161 B    1/2016
CN    108110098 A    6/2018
(Continued)

OTHER PUBLICATIONS

Extended European Search Report dated Nov. 2, 2020 for corresponding European Application No. 20177054.2.
(Continued)

*Primary Examiner* — Jay C Kim
(74) *Attorney, Agent, or Firm* — Harness, Dickey & Pierce, P.L.C.

(57) ABSTRACT

A semiconductor thin film structure may include a substrate, a buffer layer on the substrate, and a semiconductor layer on the buffer layer, such that the buffer layer is between the semiconductor layer and the substrate. The buffer layer may include a plurality of unit layers. Each unit layer of the plurality of unit layers may include a first layer having first bandgap energy and a first thickness, a second layer having second bandgap energy and a second thickness, and a third layer having third bandgap energy and a third thickness. One layer having a lowest bandgap energy of the first, second, and third layers of the unit layer may be between another two layers of the first, second, and third layers of the unit layer.

26 Claims, 20 Drawing Sheets

(51) Int. Cl.
*H01L 29/20* (2006.01)
*H01L 29/205* (2006.01)
*H01L 29/778* (2006.01)

(56) References Cited

U.S. PATENT DOCUMENTS

| | | | | |
|---|---|---|---|---|
| 8,247,842 | B2* | 8/2012 | Sato | H01L 29/205 257/190 |
| 8,563,984 | B2* | 10/2013 | Sato | H01L 29/7787 257/190 |
| 8,742,396 | B2* | 6/2014 | Ooshika | H01L 21/02458 257/15 |
| 8,946,773 | B2* | 2/2015 | Tak | H01L 21/02505 257/190 |
| 8,963,164 | B2* | 2/2015 | Shimizu | H01L 21/0254 438/479 |
| 9,136,430 | B2* | 9/2015 | Tak | H01L 21/02458 |
| 9,184,242 | B2* | 11/2015 | Kaneko | H01L 21/0251 |
| 9,660,068 | B2 | 5/2017 | Inoue et al. | |
| 9,991,346 | B2* | 6/2018 | Derluyn | H01L 21/0262 |
| 10,256,368 | B2* | 4/2019 | Eum | H01L 29/2003 |
| 10,586,701 | B2* | 3/2020 | Shikauchi | H01L 29/7786 |
| 10,763,332 | B2* | 9/2020 | Yamada | H01L 21/02381 |
| 2004/0119063 | A1 | 6/2004 | Guo et al. | |
| 2005/0110043 | A1 | 5/2005 | Otsuka et al. | |
| 2007/0145406 | A1 | 6/2007 | Han et al. | |
| 2010/0123169 | A1 | 5/2010 | Sato | |
| 2010/0244096 | A1 | 9/2010 | Sato | |
| 2013/0307023 | A1* | 11/2013 | Kokawa | H01L 21/02458 257/190 |
| 2013/0307024 | A1* | 11/2013 | Kokawa | H01L 33/12 257/190 |
| 2014/0001439 | A1 | 1/2014 | Chen et al. | |
| 2020/0350426 | A1* | 11/2020 | Fang | H01L 29/157 |

FOREIGN PATENT DOCUMENTS

| | | | |
|---|---|---|---|
| EP | 2369643 A2 | 9/2011 | |
| JP | WO 2017/145199 * | 8/2017 | H01L 21/338 |
| WO | WO-2015-068448 A1 | 5/2015 | |

OTHER PUBLICATIONS

Ni, Yiqiang et al., "Effect of AlN/GaN superlattice buffer on the strain state in GaN-on-Si(111) system", Japanese Journal of Applied Physics, vol. 54, 015505, (2015), http://dx.doi.org/10.7567/JJAP.54.015505.

* cited by examiner x>w>y

SEMICONDUCTOR THIN FILM STRUCTURES AND ELECTRONIC DEVICES INCLUDING THE SAME

CROSS-REFERENCE TO RELATED APPLICATION

This application claims the benefit of Korean Patent Application No. 10-2019-0129326, filed on Oct. 17, 2019, in the Korean Intellectual Property Office, the disclosure of which is incorporated herein in its entirety by reference.

BACKGROUND

1. Field

The present disclosure relates to thin film structures and electronic devices including the same.

2. Description of Related Art

Recently, as more systems using high power have been developed, electronic devices using nitride semiconductors have been actively developed. Since a pure nitride semiconductor substrate is small and expensive, generally, a nitride semiconductor is grown on a different kind of substrate such as a sapphire substrate, a silicon carbide (SiC) substrate, or a silicon (Si) substrate, and a device is formed thereon.

When a nitride semiconductor is grown on a different kind of substrate, defects due to mismatches in lattice constants, warpage or cracks due to mismatches in coefficients of thermal expansion (CTE), or the like, may occur.

SUMMARY

Provided are semiconductor thin film structures including a high-quality semiconductor layer. Such structures may include a nitride semiconductor having a thickness of several micrometers (μm) or more with reduced or minimized defects due to mismatches in lattice constants and/or the warpage or cracks due to mismatches in coefficients of thermal expansion (CTE).

Provided are electronic devices including the semiconductor thin film structures.

Additional aspects will be set forth in part in the description which follows and, in part, will be apparent from the description, or may be learned by practice of the presented example embodiments of the disclosure.

According to some example embodiments, a semiconductor thin film structure may include a substrate, a buffer layer on the substrate, and a semiconductor layer on the buffer layer, such that the buffer layer is between the semiconductor layer and the substrate. The buffer layer may include a plurality of unit layers. Each unit layer of the plurality of unit layers may include a first layer having first bandgap energy and a first thickness, a second layer having second bandgap energy and a second thickness, and a third layer having third bandgap energy and a third thickness. One layer having a lowest bandgap energy of the first, second, and third layers of the unit layer may be between another two layers of the first, second, and third layers of the unit layer.

The first layer of the unit layer may be proximate to the substrate in relation to the second layer and the third layer of the unit layer, and the third layer of the unit layer may be distal to the substrate in relation to the first layer and the second layer of the unit layer.

The second thickness may be less than the first thickness, and the second thickness may be less than the third thickness.

The first layer may be configured to adjust warpage of the substrate.

The first bandgap energy may be higher than the second bandgap energy, and the first bandgap energy may be lower than the third bandgap energy.

The first thickness may be greater than the second thickness, and the first thickness may be greater than the third thickness.

A sum of the first thickness and the second thickness may be in a range of about 200% of the third thickness to about 1500% of the third thickness.

The sum of the first thickness and the second thickness may be in a range of about 400% of the third thickness to about 900% of the third thickness.

The third layer may be configured to at least partially inhibit a current flow in the buffer layer in a thickness direction of the buffer layer.

A magnitude of a difference between the second bandgap energy and the third bandgap energy may be equal to or greater than about 200% of a magnitude of a difference between the second bandgap energy and the first bandgap energy.

The first layer may include $Al_w Ga_{(1-w)}N (0<w\leq0.5)$.

The second layer may include $Al_y Ga_{(1-y)}N (0<y\leq0.1, y<w)$.

The third layer may include $Al_x Ga_{(1-x)}N (w<x\leq1)$.

The third layer may include $Al_x Ga_{(1-x)}N (0.7\leq x\leq1)$.

Each unit layer may further include a fourth layer on the third layer of the unit layer, the fourth layer having a fourth bandgap energy, the fourth bandgap energy having a variable magnitude in a thickness direction of the fourth layer, such that a magnitude of the fourth bandgap energy varies in the thickness direction of the fourth layer between a magnitude of the third bandgap energy to a magnitude of the first bandgap energy.

The fourth layer may include $Al_z Ga_{(1-z)}N$, z may have a different value depending on a position of the fourth layer in the unit layer in a thickness direction of the buffer layer, and an average value z(average) of the z values may satisfy y<w<z(average)<x.

Each unit layer may further include a fifth layer between the second layer of the unit layer and the third layer of the unit layer, the fifth layer having a fifth bandgap energy, the fifth bandgap energy having a variable magnitude in a thickness direction of the fifth layer, such that a magnitude of the fifth bandgap energy varies in the thickness direction of the fifth layer between a magnitude of the second bandgap energy to a magnitude of the third bandgap energy.

The fifth layer may include $Al_v Ga_{(1-v)}N$, v may have a different value depending on a position of the fifth layer in a thickness direction of the buffer layer, and an average value v(average) of the v values may satisfy y<w<v(average)<x.

The second layer may include $In_y Ga_{(1-y)}N (0\leq y\leq0.2)$, and the third layer may include AlN.

The first layer may include GaN.

The second layer includes InGaN.

The third layer may include AlN.

Each unit layer may further include a fourth layer on the third layer of the unit layer, the fourth layer having a fourth bandgap energy, the fourth bandgap energy having a variable magnitude in a thickness direction of the fourth layer, such that a magnitude of the fourth bandgap energy varies in the thickness direction of the fourth layer between a magnitude of the third bandgap energy to a magnitude of the first bandgap energy.

Each unit layer may further include a fifth layer between the second layer of the unit layer and the third layer of the unit layer, the fifth layer having a fifth bandgap energy, the fifth bandgap energy having a variable magnitude in a thickness direction of the fifth layer, such that a magnitude of the fifth bandgap energy varies in the thickness direction of the fifth layer between a magnitude of the second bandgap energy to a magnitude of the third bandgap energy.

Each layer of the first layer, the second layer, and the third layer may include Al, In, Ga, and N, and may include a quaternary nitride having a different composition ratio.

An average value of bandgap energy of layers included in each unit layer of the plurality of unit layers may decrease in a direction from the substrate toward the semiconductor layer.

According to some example embodiments, an electronic device may include the semiconductor thin film structure, a source electrode and a drain electrode which are in contact with separate, respective sides of the semiconductor layer and are isolated from direct contact with each other, and a gate electrode on the semiconductor layer.

The electronic device may further include a depletion layer between the semiconductor layer and the gate electrode.

The depletion layer may further include p-GaN.

According to some example embodiments, a buffer layer structure may include at least one unit layer that includes a first layer having first bandgap energy and a first thickness, a second layer having second bandgap energy and a second thickness, and a third layer having third bandgap energy and a third thickness. One layer having a lowest bandgap energy of the first, second, and third layers of the unit layer may be between another two layers of the first, second, and third layers of the unit layer.

The second layer of the unit layer may be between the first layer of the unit layer and the third layer of the unit layer.

The second thickness may be less than the first thickness, and the second thickness may be less than the third thickness.

The first bandgap energy may be higher than the second bandgap energy, and the first bandgap energy may be lower than the third bandgap energy.

Each unit layer may further include a fourth layer on the third layer of the unit layer, the fourth layer having a fourth bandgap energy, the fourth bandgap energy having a variable magnitude in a thickness direction of the fourth layer, such that a magnitude of the fourth bandgap energy varies in the thickness direction of the fourth layer between a magnitude of the third bandgap energy to a magnitude of the first bandgap energy.

Each unit layer may further include a fifth layer between the second layer of the unit layer and the third layer of the unit layer, the fifth layer having a fifth bandgap energy, the fifth bandgap energy having a variable magnitude in a thickness direction of the fifth layer, such that a magnitude of the fifth bandgap energy varies in the thickness direction of the fifth layer between a magnitude of the second bandgap energy to a magnitude of the third bandgap energy.

Each layer of the first layer, the second layer, and the third layer may include Al, In, Ga, and N, and may include a quaternary nitride having a different composition ratio.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Figure 1A:
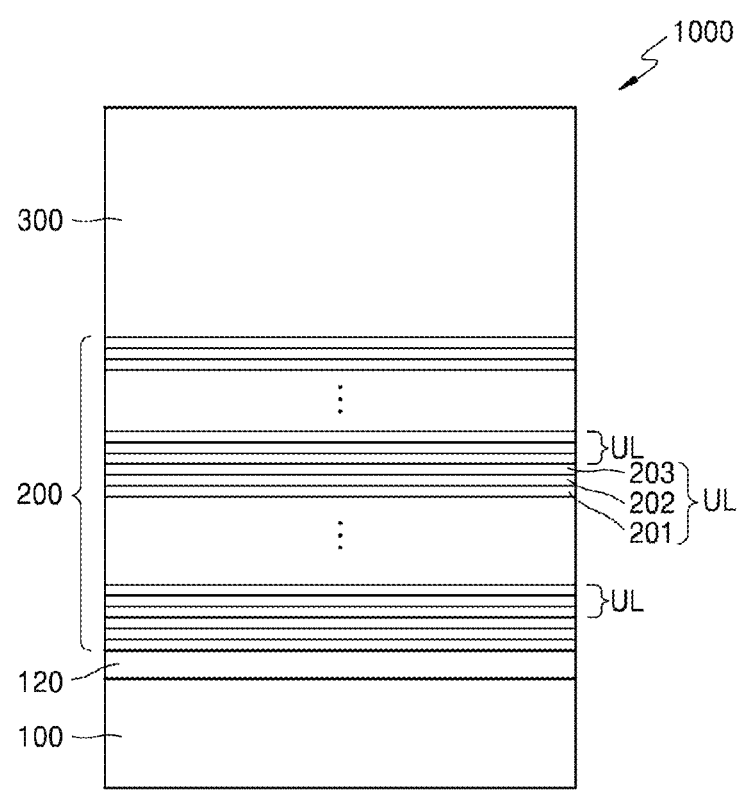
FIG. 1A is a schematic cross-sectional view of a semiconductor thin film structure according to some example embodiments.

Reference will now be made in detail to example embodiments, some of which are illustrated in the accompanying drawings, wherein like reference numerals refer to like elements throughout. In this regard, some example embodiments may have different forms and should not be construed as being limited to the descriptions set forth herein. Accordingly, some example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, some example embodiments of the present disclosure will be described in detail with reference to the accompanying drawings. Various modifications are possible from the described example embodiments. In the following drawings, like numbers refer to like elements, and the size of each element may be exaggerated for clarity and convenience of description.

Hereinafter, when a part of a layer, film, region, plate, etc. is said to be "on" or "over" another part, it includes not only being directly on another part but also having another part therebetween.

Although the terms "first," "second," etc. may be used herein to describe various elements, these elements should not be limited by these terms. These terms are only used to distinguish one element from another element.

The singular forms "a," "an" and "the" are intended to include the plural forms as well, unless the context clearly indicates otherwise. When a part is said to "include" a component, this means that, unless specifically stated otherwise, it may further include other components rather than excluding other components.

The terms " . . . unit" and "module" described in the specification mean a unit that processes at least one function or operation, and may be implemented in hardware or software, or a combination of hardware and software.

The use of the term "above-described or aforementioned" and similar indicating terminology may correspond to both the singular form and the plural form.

The steps at least partially comprising the method may be performed in a suitable order, unless there is an explicit statement that they should be done in the order described. The use of all example terms (e.g., etc.) is merely for the purpose of describing the technical spirit in detail and is not intended to limit the scope of the rights as such terms are not limited by the claims.

Figure 1B:
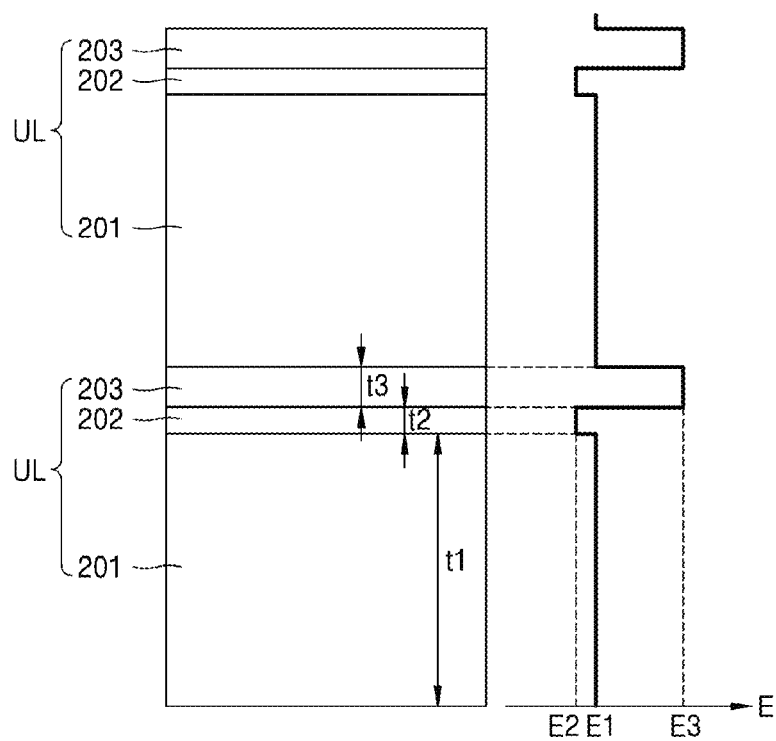
FIG. 1B is a view illustrating a detailed enlarged structure of a part of a buffer layer included in the semiconductor thin film structure of FIG. 1A and a band gap energy change in a thickness direction.

FIG. 1A is a schematic cross-sectional view of a semiconductor thin film structure according to some example embodiments, and FIG. 1B is a view illustrating a detailed enlarged structure of a part of a buffer layer included in the semiconductor thin film structure of FIG. 1A and a band gap energy change in a thickness direction.

A semiconductor thin film structure 1000 includes a substrate 100, a buffer layer 200 formed on (e.g., directly or indirectly on) the substrate 100, and a semiconductor layer 300 formed on (e.g., directly or indirectly on) the buffer layer 200, such that the buffer layer 200 is between the substrate 100 and the semiconductor layer 300. A nucleation layer 120 may be disposed between the substrate 100 and the buffer layer 200, such that the buffer layer 200 that is on the substrate 100 is "indirectly" on the substrate 100.

The semiconductor layer 300 may include an active layer to be used for various electronic devices and may include Group III-V compound semiconductors. The semiconductor layer 300 may include a nitride semiconductor. That is, the Group III element may be at least one selected from Al, Ga, and In, and the Group V element may be N. Although it is shown in the drawings that the semiconductor layer 300 has a single-layer structure, this is an example for convenience, and the semiconductor layer 300 may include a plurality of layers. The semiconductor layer 300 may include an undoped layer or may include a layer doped with a predetermined conductive carrier. Some of the plurality of layers at least partially comprising the semiconductor layer 300 may be doped with an n-type dopant, and others thereof may be doped with a p type dopant. The plurality of layers at least partially comprising the semiconductor layer 300 may include layers doped with the same conductive carrier in different concentrations.

The substrate 100 may be a substrate different from the semiconductor layer 300. For example, the semiconductor layer 300 may include a Group III-V compound semiconductor, and the substrate 100 may be a sapphire substrate, a silicon carbide (SiC) substrate, or a silicon (Si) substrate.

The buffer layer 200 is provided in order to mitigate the occurrence of defects, cracks, stress, etc. due to lattice constant mismatch and thermal expansion coefficient mismatch between the substrate 100 and the semiconductor layer 300 and to implement the semiconductor layer 300 of good quality.

For example, when a GaN thin film is directly grown on a silicon substrate, thermal tensile stress is applied to the GaN thin film due to a difference in thermal expansion coefficient between GaN and Si, and thus, the substrate may be warped. Further, when the thermal tensile stress exceeds a critical point, cracks may occur. Further, defects may occur due to a lattice constant difference.

In order to mitigate such a phenomenon, the semiconductor thin film structure according to some example embodiments includes a buffer layer 200 having a superlattice structure in which unit layers UL each including a plurality of layers having different bandgap energy are repeatedly arranged between the substrate 100 and the semiconductor layer 300.

The nucleation layer 120 may be formed between (e.g., directly between as shown in FIG. 1A) the substrate 100 and the buffer layer 200 and may prevent a melt-back phenomenon caused by the reaction of a nitride semiconductor material included in the buffer layer 200 with the substrate 100 to enable the buffer layer 200 to be grown thereafter to be well wetted. The nucleation layer 120 may include AlN. In the growth stage of the nucleation layer 120, an Al source is initially injected, thereby preventing the substrate 100 from being exposed to ammonia first and being nitrided. The nucleation layer 120 may have a thickness of several tens to several hundreds of nanometers. The nucleation layer 120 may be formed to have a thickness ranging from about 50 nm to about 300 nm.

An $Al_xGa_{1-x}N(0<x<1)$ layer (not shown) may be additionally formed between the nucleation layer 120 and the buffer layer 200.

As shown in FIG. 1A, the buffer layer 200 may include (e.g., at least partially comprise) a plurality of unit layers UL. Each of the unit layers UL at least partially comprising the buffer layer 200 may include a first layer 201, a second layer 202, and a third layer 203 (e.g., a stack of a first layer 201, a second layer 202, and a third layer 203). The first layer 201 has a first thickness t1 and first bandgap energy E1, and the second layer 202 has a second thickness t2 and second bandgap energy E2, and the third layer 203 has a third thickness t3 and third bandgap energy E3.

The thicknesses, t1, t2, and t3 and the band gap energy E1, E2, and E3 may be set (e.g., configured) to control the stress applied to the semiconductor layer 300 formed on the buffer layer 200 and to at least partially (e.g., partially or completely) inhibit the flow of a current in the buffer layer 200 in a first direction (e.g., a thickness direction of the buffer layer that may extend from the substrate 100 and toward the semiconductor layer 300).

The layer having lowest band gap energy among the first layer 201, the second layer 202, and the third layer 203 at least partially comprising the unit layer UL may be between the other two layers of the same unit layer. Restated, in a given unit layer UL, one layer having a lowest bandgap energy of the first, second and third layers 201, 202, 203 of the unit layer UL is between another two layers of the first, second, and third layers 202, 202, 203 of the unit layer UL. For example, when the first layer 201, the second layer 202, and the third layer 203 of a given unit layer UL are sequentially arranged in a direction from the substrate 100 toward the semiconductor layer 300 (e.g., in a first direction, such as the thickness direction of the buffer layer 200, such that the third layer 203 of the given unit layer UL is distal from the substrate 100 in relation to the first and second layers 201 and 202 and the first layer 201 of the given unit layer UL is proximate to the substrate 100 in relation to the second and third layers 202 and 203), the bandgap energy E2 of the second layer 202 may be lowest bandgap energy of the first, second, and third layers 201, 202, 203. The thickness t2 of the second layer 202 having the lowest bandgap energy (e.g., the second thickness) may be less than the thickness t1 of the first layer 201 (e.g., the first thickness) and the thickness t2 of the second layer 202 having the lowest bandgap energy (e.g., the second thickness) may be less than the thickness t3 of the third layer 203 (e.g., the third thickness).

The meaning of the respective layers at least partially comprising the unit layer UL are described in detail as follows.

The third layer 203 is a layer configured to at least partially inhibit current flow in the thickness direction of the buffer layer 200 (e.g., in a first direction from the substrate 100 toward the semiconductor layer 300) due to a difference in band gap energy from an adjacent layer. The bandgap energy E3 of the third layer 203 is higher than the first bandgap energy E1 and is higher than the second bandgap energy E2.

The first layer 201 is a layer for adjusting (e.g., configured to adjust, control, reduce, mitigate, reduce or minimize, and/or prevent) the warpage (e.g., bending, twisting, etc.) of the substrate 100, for example warpage due to a difference in thermal expansion coefficient between the semiconductor layer 300 and the substrate 100, a thermal tensile stress between the semiconductor layer 300 and the substrate 100, and/or a lattice constant difference between the semiconductor layer 300 and the substrate 100, for example based on the first layer 201 having a bandgap energy between that of the second and third layers 202 and 203 and being a proximate layer, of a unit layer UL, to the substrate 100. The bandgap energy E1 of the first layer 201 is lower (e.g., smaller) than the bandgap energy E3 of the third layer 203 and may be higher (e.g., greater) than the bandgap energy E2 of the second layer. The thickness t1 of the first layer 201 (e.g., the first thickness) is greater than the thickness t2 of the second layer 202 (e.g., the second thickness), and the thickness t1 of the first layer 201 (e.g., the first thickness) is greater than the thickness t3 of the third layer 203 (e.g., the third thickness).

The second layer 202 may have the lowest bandgap energy E2 to increase or maximize the role of the third layer 203, that is, the action of inhibiting current flow. The thickness t2 of the second layer 202 is less than the thickness t1 of the first layer or the thickness t3 of the third layer 203 in order to reduce or minimize the influence on the warpage of the substrate 100.

The sum of the thickness t1 of the first layer 201 and the thickness t2 of the second layer 202 may be in a range of about 2 times to about 15 times the thickness t3 of the third layer 203 (e.g., between about 2(t3) to about 15(t3), between about 200% of the thickness t3 to about 1500% of the thickness t3, etc.). For example, the sum t1+t2 of the thickness t1 of the first layer 201 and the thickness t2 of the second layer 202 may be in a range of 4 times to 9 times the thickness t3 of the third layer 203 (e.g., between about 4(t3) to about 9(t3), between about 400% of the thickness t3 to about 900% of the thickness t3, etc.).

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

The difference between the bandgap energy E3 of the third layer 203 and the bandgap energy E2 of the second layer 202 may be greater than the bandgap energy E1 of the first layer 201. The difference between the band gap energy E3 of the third layer 203 and the band gap energy E2 of the second layer 202 may be greater than the difference between the bandgap energy E2 of the second layer 202 and the bandgap energy E1 of the first layer 201. The magnitude of the difference between the band gap energy E3 of the third layer 203 and the band gap energy E2 of the second layer 202 may be two times or more the magnitude of the difference between the bandgap energy E2 of the second layer 202 and the bandgap energy E1 of the first layer 201 (e.g., the absolute value of (E3−E2) may be equal to greater than about 200% of the absolute value of (E2−E1).

The bandgap energy and thickness of each of the first layer 201, the second layer 202, and the third layer 203 may be expressed in the following relative relationship.

|  | Bandgap energy | Thickness |
| --- | --- | --- |
| First layer | mid | thick |
| Second layer | small | thin |
| Third layer | large | mid |

That is, the bandgap energy, E1, E2, and E3 and thicknesses, t1, t2, and t3 of the first layer 201, the second layer 202, and the third layer 203 may have a relationship of E3>E1>E2 and t1>t3>t2.

The above relationship is derived from the requirements that three layers or more at least partially comprise the unit layer, the layer having the lowest bandgap energy is thinnest, and the layer having the middle bandgap energy is thickest. However, the relationship is not limited thereto. Most embodiments to be described below satisfy the requirements, but some embodiments may not satisfy all of the requirements presented at the same time.

In the above description, the structure of the repeating unit layer UL is named as the first layer 201, the second layer 202, and the third layer 203 in the order from the substrate 100 toward the semiconductor layer 300, and the order of stacking on the substrate 100 does not necessarily have to begin with the first layer 201.

In order to satisfy the aforementioned relationship, the unit layer UL may be configured by a combination of various layers.

The first layer 201 may include AlGaN and may have a thickness ranging from about 10 nm to about 70 nm. The composition ratio of Al may be about 0% to about 50%.

The second layer 202 may include GaN and may have a thickness ranging from about 1 nm to about 20 nm. The second layer 202 may include AlGaN, and in this case, the composition ratio of Al may be about 0% to about 10%. The second layer 202 may include InGaN, and in this case, the composition ratio of In may be about 0% to about 20%.

The third layer 203 may include AlN and may have a thickness ranging from about 2 nm to about 15 nm. The third layer 203 may include AlGaN, and in this case, the composition ratio of Al may be about 70% to about 100%.

Figure 2A:
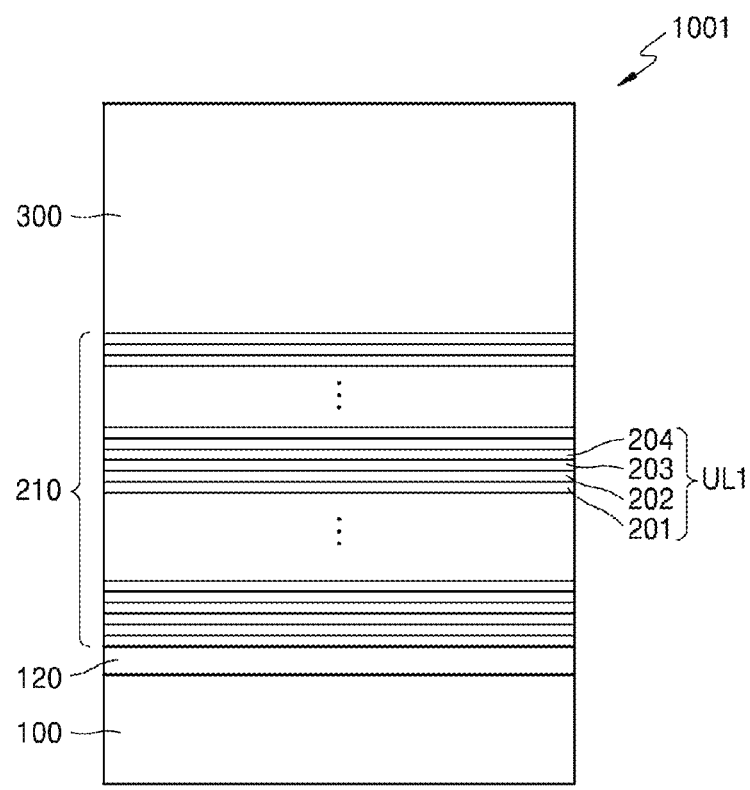
FIG. 2A is a schematic cross-sectional view of a semiconductor thin film structure according to some example embodiments.
Figure 2B:
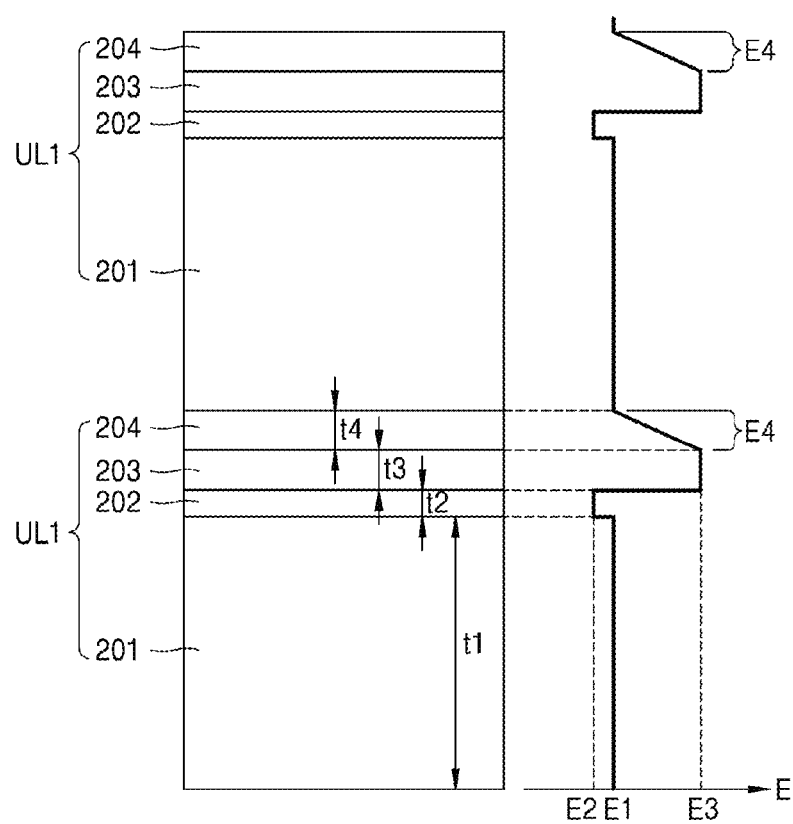
FIG. 2B is a view illustrating a detailed enlarged structure of a part of a buffer layer included in the semiconductor thin film structure of FIG. 2A and a band gap energy change in a thickness direction.

FIG. 2A is a schematic cross-sectional view of a semiconductor thin film structure according to some example embodiments, and FIG. 2B is a view illustrating a detailed enlarged structure of a part of a buffer layer included in the semiconductor thin film structure of FIG. 2A and a band gap energy change in a thickness direction.

A semiconductor thin film structure 1001 includes a substrate 100, a buffer layer 210, and a semiconductor layer 300. A nucleation layer 120 may be disposed between the substrate 100 and the buffer layer 210. The buffer layer 210 includes unit layers UL1 repeatedly stacked several times.

Each of the unit layers UL1 at least partially comprising the buffer layer 210 includes a first layer 201, a second layer 202, and a third layer 203. The first layer 201 has a first thickness t1 and first bandgap energy E1, the second layer 202 has a second thickness t2 and second bandgap energy E2, and the third layer 203 has a third thickness t3 and third bandgap energy E3.

The unit layer UL1 of some example embodiments (and, in some example embodiments, each unit layer UL1 of the buffer layer 210) further includes a fourth layer 204 disposed on (e.g., directly or indirectly on) the third layer 203 and having a fourth thickness t4 and fourth bandgap energy.

The fourth bandgap energy has a distribution changing from the third bandgap energy E3 to the first bandgap energy E1 in the thickness direction in the fourth layer 204. Restated, the fourth layer 204 may have a fourth bandgap energy E4 that varies (continuously or noncontinuously, e.g., in steps) from the magnitude of the third bandgap energy E3 (e.g., at a surface of the fourth layer 204 that contacts the third layer 203) to the magnitude of the first bandgap energy E1 (e.g., at a surface of the fourth layer 204 that contacts the first layer 201) in the thickness direction of the fourth layer 204 (e.g., varies continuously or in steps between the surface of the fourth layer 204 that contacts the third layer 203 to the surface of the fourth layer 204 that contacts the first layer 201). Although a linear and continuous distribution is shown in the drawings, this is an example. For example, the fourth bandgap energy may have a distribution nonlinearly changing from the third bandgap energy E3 to the first bandgap energy E1. In some example embodiments, the fourth bandgap energy may have a distribution non-continuously changing from the third bandgap energy E3 to the first bandgap energy E1. For example, the fourth bandgap energy may have a distribution changing in a step shape. In some example embodiments, the fourth bandgap energy may have a mixed distribution of a continuous (linear or nonlinear) distribution and a noncontinuous (stepped) distribution as the distribution changing from the third bandgap energy E3 to the first bandgap energy E1.

The thickness t4 of the fourth layer 204 may be in a range of about 2 nm to about 25 nm.

The fourth layer 204 may include $Al_zGa_{(1-z)}N$, and z may have a different value depending on a position of the fourth layer 204 in the buffer layer 210 in the first direction (e.g., the thickness direction of the buffer layer 210).

Figure 3A:
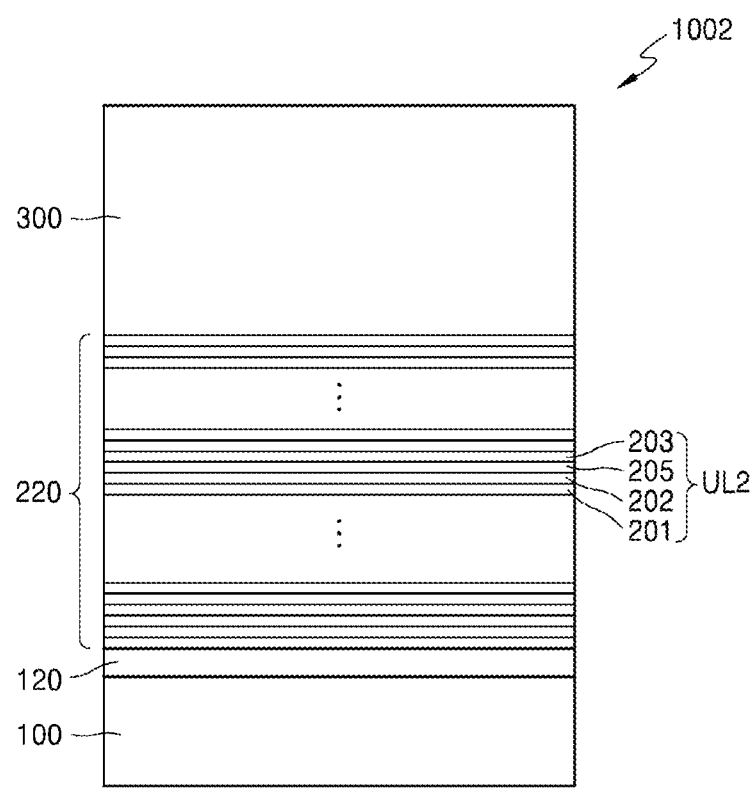
FIG. 3A is a schematic cross-sectional view of a semiconductor thin film structure according to some example embodiments.
Figure 3B:
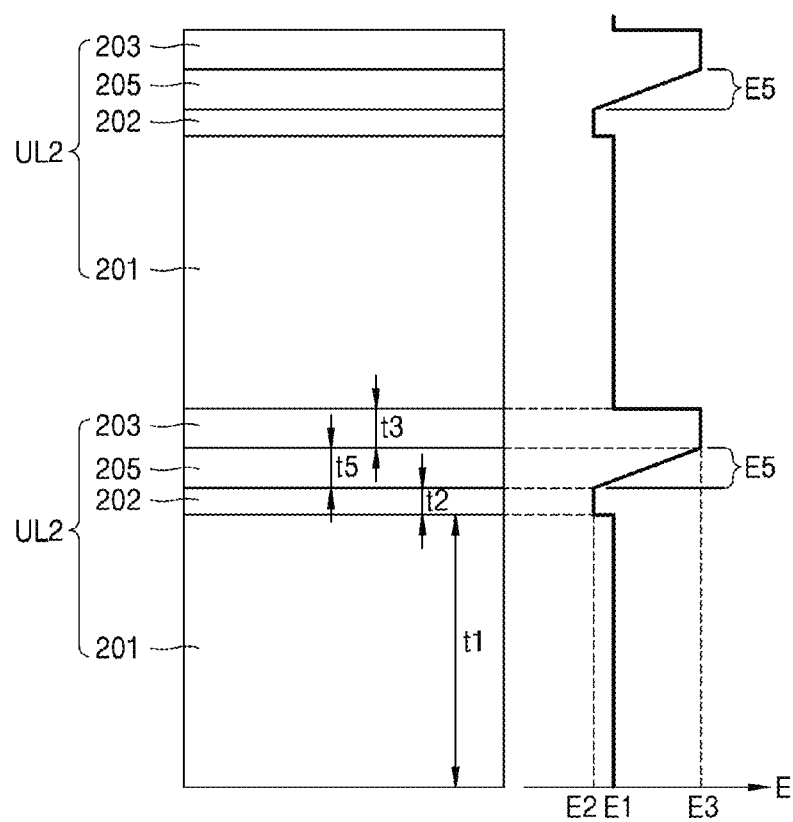
FIG. 3B is a view illustrating a detailed enlarged structure of a part of a buffer layer included in the semiconductor thin film structure of FIG. 3A and a band gap energy change in a thickness direction.

FIG. 3A is a schematic cross-sectional view of a semiconductor thin film structure according to some example embodiments, and FIG. 3B is a view illustrating a detailed enlarged structure of a part of a buffer layer included in the semiconductor thin film structure of FIG. 3A and a band gap energy change in a thickness direction.

A semiconductor thin film structure 1002 includes a substrate 100, a buffer layer 220, and a semiconductor layer 300. A nucleation layer 120 may be disposed between the substrate 100 and the buffer layer 220. The buffer layer 220 includes unit layers UL2 repeatedly stacked several times.

Each of the unit layers UL2 at least partially comprising the buffer layer 220 includes a first layer 201, a second layer 202, and a third layer 203. The first layer 201 has a first thickness t1 and first bandgap energy E1, the second layer 202 has a second thickness t2 and second bandgap energy E2, and the third layer 203 has a third thickness t3 and third bandgap energy E3.

The unit layer UL2 of some example embodiments (and, in some example embodiments, each unit layer UL2 of the buffer layer 220) further includes a fifth layer 205 disposed between the second layer 202 and the third layer 203 and having a fifth thickness t5 and fifth bandgap energy.

The fifth bandgap energy has a distribution changing from the second bandgap energy E2 to the third bandgap energy E3 in the thickness direction in the fifth layer 205. Although a linear and continuous distribution is shown in the drawings, this is an example. For example, the fifth bandgap energy may have a distribution nonlinearly changing from the second bandgap energy E2 to the third bandgap energy E3. In some example embodiments, the fifth bandgap energy may have a distribution non-continuously changing from the second bandgap energy E2 to the third bandgap energy E3. Restated, the fifth layer 205 may have a fifth bandgap energy E5 that varies (continuously or noncontinuously, e.g., in steps) from the magnitude of the third bandgap energy E3 (e.g., at a surface of the fifth layer 205 that contacts the third layer 203) to the magnitude of the second bandgap energy E2 (e.g., at a surface of the fifth layer 205 that contacts the second layer 202) in the thickness direction of the fifth layer 205 (e.g., varies continuously or in steps between the surface of the fifth layer 205 that contacts the third layer 203 to the surface of the fifth layer 205 that contacts the second layer 202). For example, the fifth bandgap energy may have a distribution changing in a step shape. In some example embodiments, the fifth bandgap energy may have a mixed distribution of a continuous (linear or nonlinear) distribution and a noncontinuous (stepped) distribution as the distribution changes from the second bandgap energy E2 to the third bandgap energy E3.

The thickness t5 of the fifth layer 205 may be in a range of about 2 nm to about 25 nm.

The fifth layer 205 may include $Al_vGa_{(1-v)}N$, and v may have a different value depending on a position of the fifth layer 205 in the buffer layer 220 in the first direction (e.g., the thickness direction of the buffer layer 220).

Figure 4A:
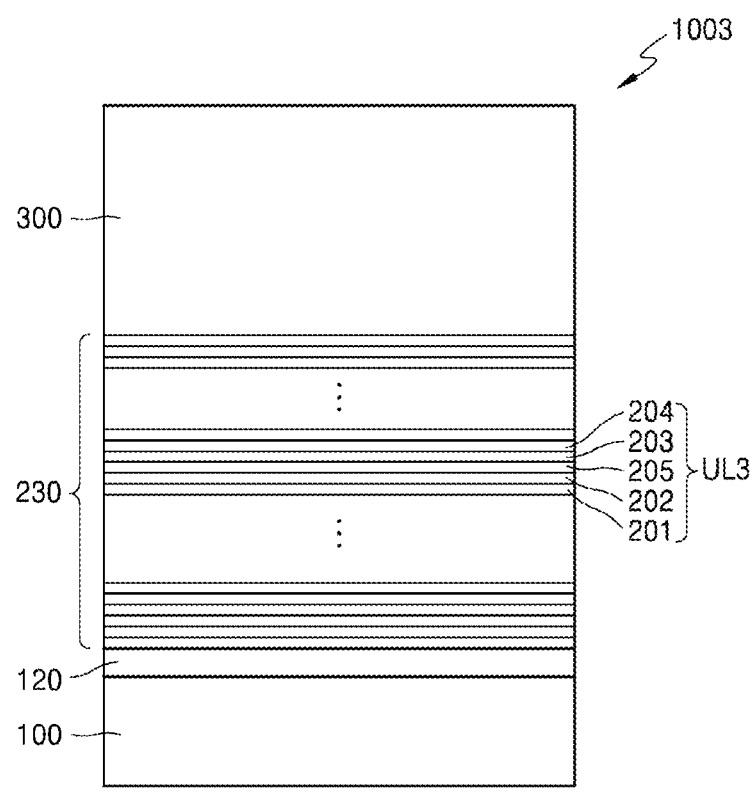
FIG. 4A is a schematic cross-sectional view of a semiconductor thin film structure according to some example embodiments.
Figure 4B:
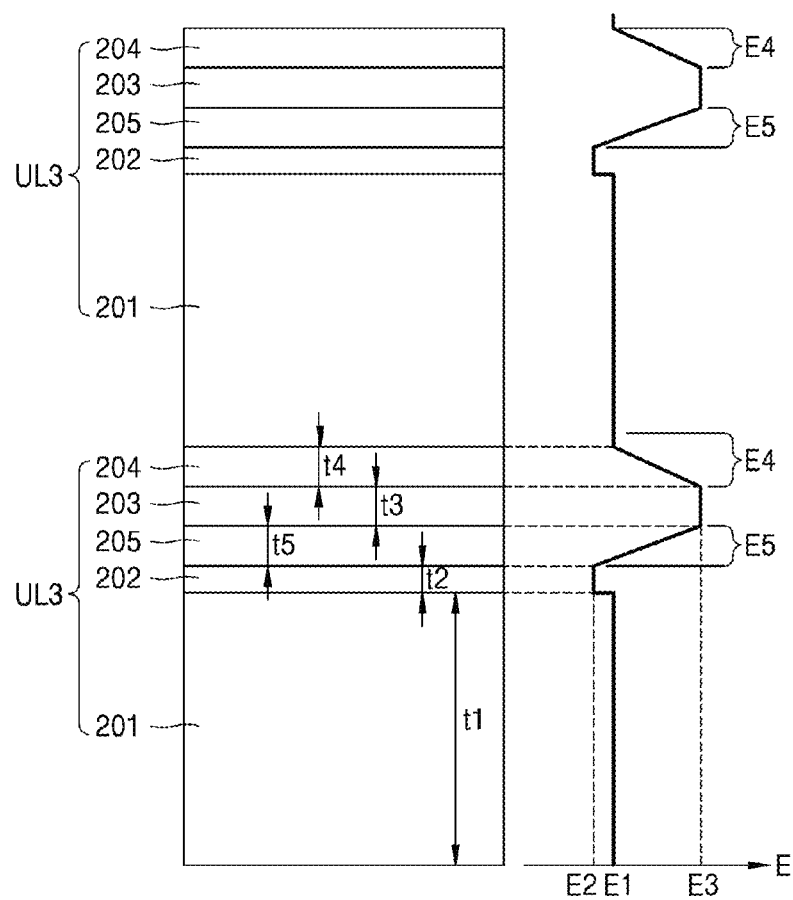
FIG. 4B is a view illustrating a detailed enlarged structure of a part of a buffer layer included in the semiconductor thin film structure of FIG. 4A and a band gap energy change in a thickness direction.

FIG. 4A is a schematic cross-sectional view of a semiconductor thin film structure according to some example embodiments, and FIG. 4B is a view illustrating a detailed enlarged structure of a part of a buffer layer included in the semiconductor thin film structure of FIG. 4A and a band gap energy change in a thickness direction.

A semiconductor thin film structure 1003 includes a substrate 100, a buffer layer 230, and a semiconductor layer 300. A nucleation layer 120 may be disposed between the substrate 100 and the buffer layer 230. The buffer layer 230 includes unit layers UL3 repeatedly stacked several times.

Each of the unit layers UL3 at least partially comprising the buffer layer 230 includes a first layer 201, a second layer 202, and a third layer 203. The first layer 201 has a first thickness t1 and first bandgap energy E1, the second layer 202 has a second thickness t2 and second bandgap energy E2, and the third layer 203 has a third thickness t3 and third bandgap energy E3.

The unit layer UL3 of some example embodiments further includes a fifth layer 205 disposed between the second layer 202 and the third layer 203 and having a fifth thickness t5 and fifth bandgap energy, and a fourth layer 204 disposed on the third layer 203 and having a fourth thickness t4 and fourth bandgap energy.

The bandgap energy and thicknesses of the fourth layer 204 and the fifth layer 205 may have energy distributions and thickness ranges as described with reference to FIGS. 2B and 3B, respectively.

It will be understood that the buffer layer according to any of the example embodiments described herein (e.g., buffer layers 200, 210, 220, 230, and/or 250) may be present independently of semiconductor layer 300 and/or substrate 100 and/or nucleation layer 120. In such example embodiments, the buffer layer according to any of the example embodiments may be referred to as a "buffer layer structure" and may be a thin-film structure that excludes the semiconductor layer 300, nucleation layer 120, and/or substrate 100. It will be understood that the buffer layer according to any of the example embodiments described herein (e.g., buffer layers 200, 210, 220, 230, and/or 250) may include a plurality of unit layers or a single, individual unit layer, where the single, individual unit layer includes any of the example embodiments of unit layers described herein.

FIGS. 5, 6, 7, 8, 9, 10, 11, and 12 are cross-sectional views illustrating specific examples of a unit layer that may be applied to a buffer layer provided in a semiconductor thin film structure according to embodiments.

In the following descriptions, nitride semiconductor materials are illustrated to at least partially comprise each layer, but are not limited thereto. Various Group III-V compound semiconductor materials that satisfy the aforementioned bandgap energy relationship between adjacent layers may be employed.

Figure 5:
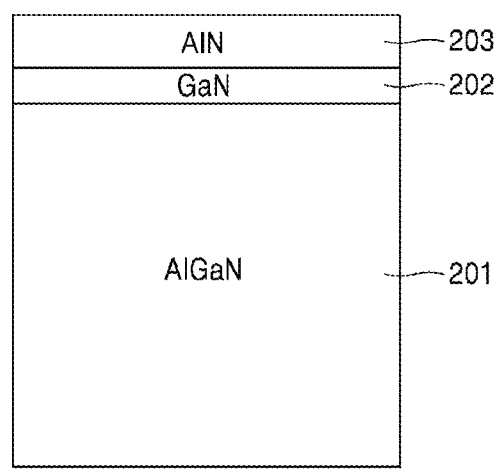
FIGS. 5, 6, 7, 8, 9, 10, 11, and 12 are cross-sectional views illustrating specific examples of a unit layer that may be applied to a buffer layer provided in a semiconductor thin film structure according to embodiments.

Referring to FIG. 5, the first layer 201 may include AlGaN, the second layer 202 may include GaN, and/or the third layer 203 may include AlN.

Figure 6:
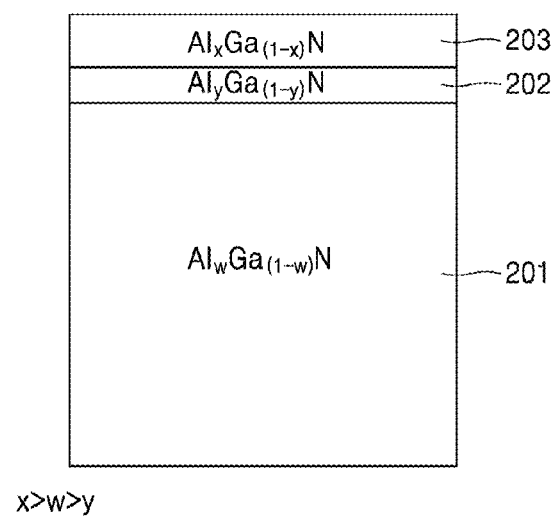

Referring to FIG. 6, the first layer 201 may include $Al_wGa_{(1-w)}N(0<w\leq0.5)$, the second layer 202 may include $Al_yGa_{(1-y)}N(0\leq y\leq0.1, y<w)$, and/or the third layer 203 may include $Al_xGa_{(1-x)}N(w<x\leq1)$. In some example embodiments, the third layer 203 may include $Al_xGa_{(1-x)}N(0.7\leq x\leq1)$.

In some example embodiments, each of the first layer 201, the second layer 202, and the third layer 203 includes a ternary system including Al, Ga, and N, and each composition ratio thereof is set from the relationship between the aforementioned band gap energies. The composition ratios w, y, and x of Al in each layer have a relationship of $x>w>y$.

Figure 7:
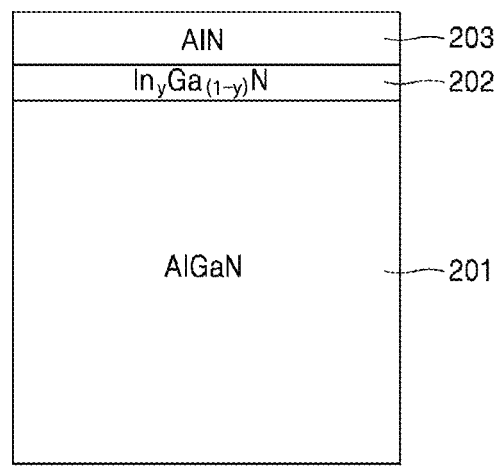

Referring to FIG. 7, the first layer 201 may include AlGaN, the second layer 202 may include $In_yGa_{(1-y)}N$ $(0\leq y\leq0.2)$, and/or the third layer 203 may include AlN. The composition ratio of Al in the first layer 201 may be 0.5 or less.

Figure 8:
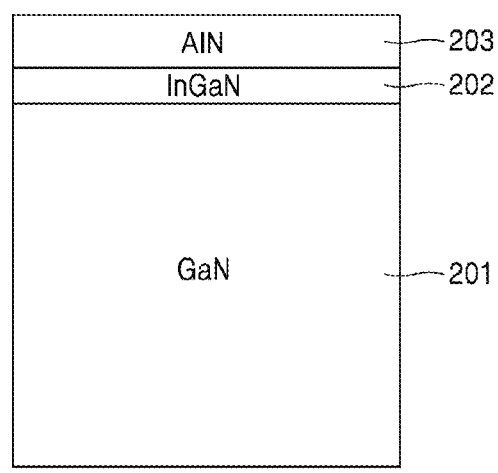

Referring to FIG. 8, the first layer 201 may include GaN, the second layer 202 may include InGaN, and/or the third layer 203 may include AlN. The composition ratio of In in the second layer 202 may be 0.2 or less.

Figure 9:
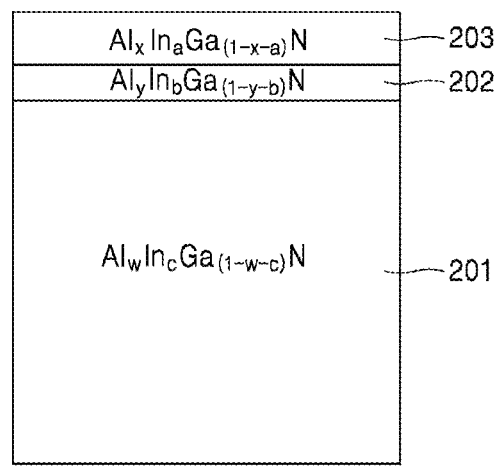

Referring to FIG. 9, each of the first layer 201, the second layer 202, and the third layer 203 may be formed as a quaternary system including Al, In, Ga, and N. In some example embodiments, each layer of the first layer 201, the second layer 202, and the third layer 203 may include Al, In, Ga, and N, and each layer of the first layer 201, the second layer 202, and the third layer 203 may include a quaternary nitride having a different composition ratio.

The first layer 201 may include $Al_wIn_cGa_{(1-w-c)}N$, the second layer 202 may include $Al_yIn_bGa_{(1-y-b)}N$, and/or the third layer 203 may include $Al_xIn_aGa_{(1-x-a)}N$. As a range of $0\leq x, y, w, a, b, c\leq1$, the above numerical values representing the composition ratio may be determined according to the band gap energy requirements of each layer.

Figure 10:
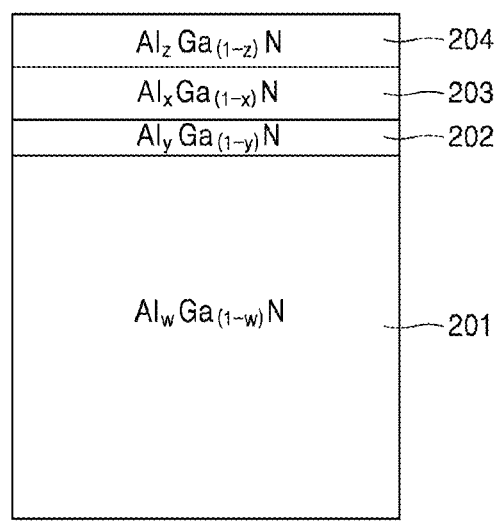

Referring to FIG. 10, the unit layer is at least partially comprised of four layers including three layers respectively having bandgap energies E1, E2, and E3 and a layer having a bandgap energy distribution changing from E3 to E1. The first layer 201 may include $Al_wGa_{(1-w)}N(0<w\leq0.5)$, the second layer 202 may include $Al_yGa_{(1-y)}N(0<y\leq0.1, y<w)$, and/or the third layer 203 may include $Al_xGa_{(1-x)}N(w<x\leq1)$. The third layer 203 may also include $Al_xGa_{(1-x)}N(0.7\leq x\leq1)$. The fourth layer 204 having a bandgap energy distribution changing from E3 to E1 may include $Al_zGa_{(1-z)}N$, and may be disposed on the third layer 203.

Each of the first layer 201, the second layer 202, the third layer 203, and the fourth layer 204 may be formed as a ternary system, and each composition ratio is set from the aforementioned relationship between the aforementioned bandgap energies. That is, in the relationship of E3>E1>E2 and the bandgap energy of the fourth layer, the composition ratio is determined to satisfy the distribution changing from E3 to E1.

The composition ratios w, y, and x of Al in the first layer 201, the second layer 202, and the third layer 203 may have a relationship of $y<w<x$. The composition ratio of Al in the fourth layer 204 may have a different value depending on a position of the fourth layer 204 in the thickness direction of the buffer layer 210. The average value z(average) of z values may satisfy the condition of $y<w<z(average)<x$.

Figure 11:
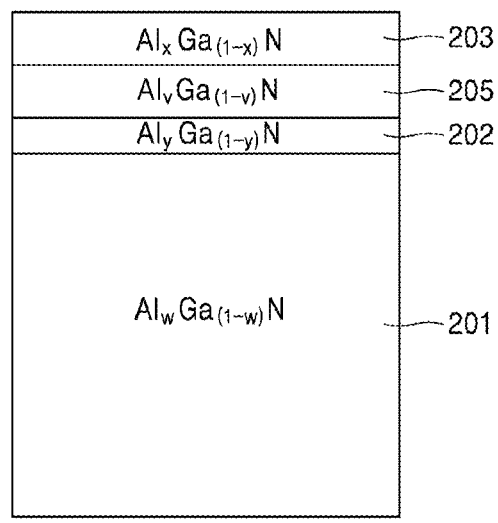

Referring to FIG. 11, the unit layer is at least partially comprised of four layers including three layers respectively having bandgap energies E1, E2, and E3 and a layer having a bandgap energy distribution changing from E2 to E3. The first layer 201 may include $Al_wGa_{(1-w)}N(0<w\leq0.5)$, the second layer 202 may include $Al_yGa_{(1-y)}N(0<y\leq0.1, y<w)$, and/or the third layer 203 may include $Al_xGa_{(1-x)}N(w<x\leq1)$. The third layer 203 may also include $Al_xGa_{(1-x)}N(0.7\leq x\leq1)$. The fifth layer 205 having a bandgap energy distribution changing from E2 to E3 may include $Al_vGa_{(1-v)}N$ and may be disposed between the second layer 202 and the third layer 203.

The composition ratios w, y, and x of Al in the first layer 201, the second layer 202, and the third layer 203 have a relationship of $y<w<x$. The composition ratio of Al in the fifth layer 205 may have a different value depending on a position of the fifth layer 205 in the thickness direction of the buffer layer 220. The average value v(average) of v values may satisfy the condition of $y<w<v(average)<x$.

Figure 12:
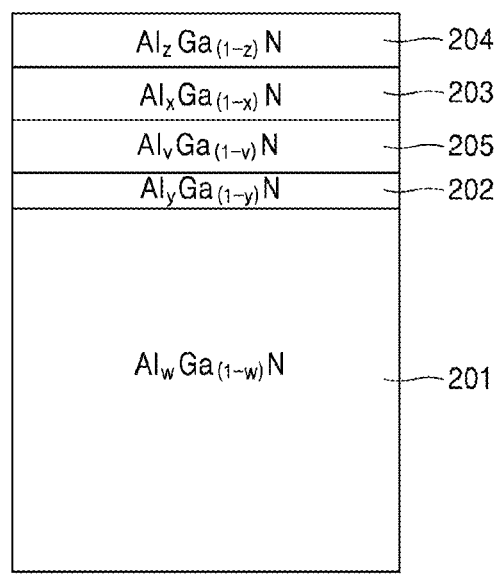

Referring to FIG. 12, the unit layer is at least partially comprised of five layers including three layers respectively having bandgap energies E1, E2, and E3, a layer having a bandgap energy distribution changing from E2 to E3, and a layer having a bandgap energy distribution changing from E3 to E1.

The first layer 201, the second layer 202, the fifth layer 205, the third layer 203, and the fourth layer 204 are arranged in this order. The composition ratio of each layer is determined from the relationship between the aforementioned band gap energies and is as described with reference to FIGS. 10 and 11.

Figure 13:
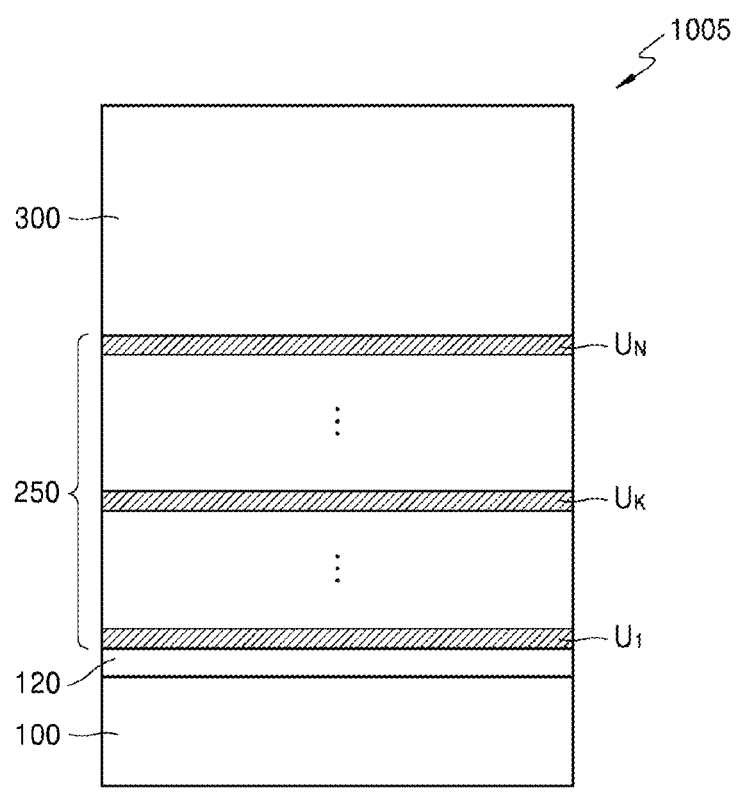
FIG. 13 is a schematic cross-sectional view of a semiconductor thin film structure according to some example embodiments.

FIG. 13 is a schematic cross-sectional view of a semiconductor thin film structure according to some example embodiments.

A semiconductor thin film structure 1005 includes a substrate 100, a buffer layer 250, and a semiconductor layer 300. A nucleation layer 120 may be disposed between the substrate 100 and the buffer layer 250. The buffer layer 250 includes unit layers $U_1, \ldots, U_k, \ldots,$ and $U_N$.

The unit layer Uk $(1\leq k\leq N)$ may be any one of the above-described unit layers UL1, UL2, or UL3. The bandgap energy average Ea_Uk of the plurality of layers included in the unit layer Uk (1≤k≤N) may satisfy the following condition.

$$Ea\_U_1 \geq Ea\_U_2 \geq \ldots Ea\_U_k \ldots \geq Ea\_U_{N-1} \geq Ea\_U_N$$

That is, the bandgap energy average decreases in a direction from the substrate 100 toward the semiconductor layer 300. This trend may be gradual or may have a stepwise shape for each section.

In order to have a bandgap energy average value having such a distribution, the average composition ratio of Al in each unit layer $U_k$(1≤k≤N) may decrease in a direction from the substrate 100 toward the semiconductor layer 300.

The unit layers Uk (1≤k≤N) may all be the same type. The unit layer Uk (1≤k≤N) may be the same type as the unit layer UL illustrated in FIG. 1B. In some example embodiments, the unit layer Uk (1≤k≤N) may be the same type as any one of the unit layer UL1 illustrated in FIG. 2B, the unit layer UL2 illustrated in FIG. 3B, or the unit layer UL1 illustrated in FIG. 4B. However, the present inventive concepts are not limited thereto. As long as the bandgap energy averaging condition is satisfied, the unit layer Ui at one position and the unit layer Uj at another position in the buffer layer 250 may have different unit layer types from each other.

The aforementioned semiconductor thin film structures according to embodiments may be manufactured using metal-organic chemical vapor deposition, (MOCVD), physical vapor deposition (PVD), or atomic layer deposition (ALD).

For example, when MOCVD is used, trimethyl gallium (TMG) may be used as a source material of Ga, trimethyl aluminum (TMA) may be used as a source material of Al, trimethyl indium (TMI) may be used as a source material of In, ammonia ($NH_3$) may be used as a source material of N, and $N_2$ gas and $H_2$ gas may be used as carrier gas. Each layer may be formed at a desired composition ratio by adjusting the amount of each source material.

The aforementioned semiconductor thin film structure may be provided with a semiconductor layer having good quality by utilizing the buffer layer, and various electronic devices may be implemented by utilizing this semiconductor thin film structure. For example, the aforementioned electronic device may include a metal-oxide semiconductor field-effect transistor (MOSFET), a high electron mobility transistor (HEMT), or a diode. In addition, the aforementioned electronic device may include a light emitting element.

Figure 14:
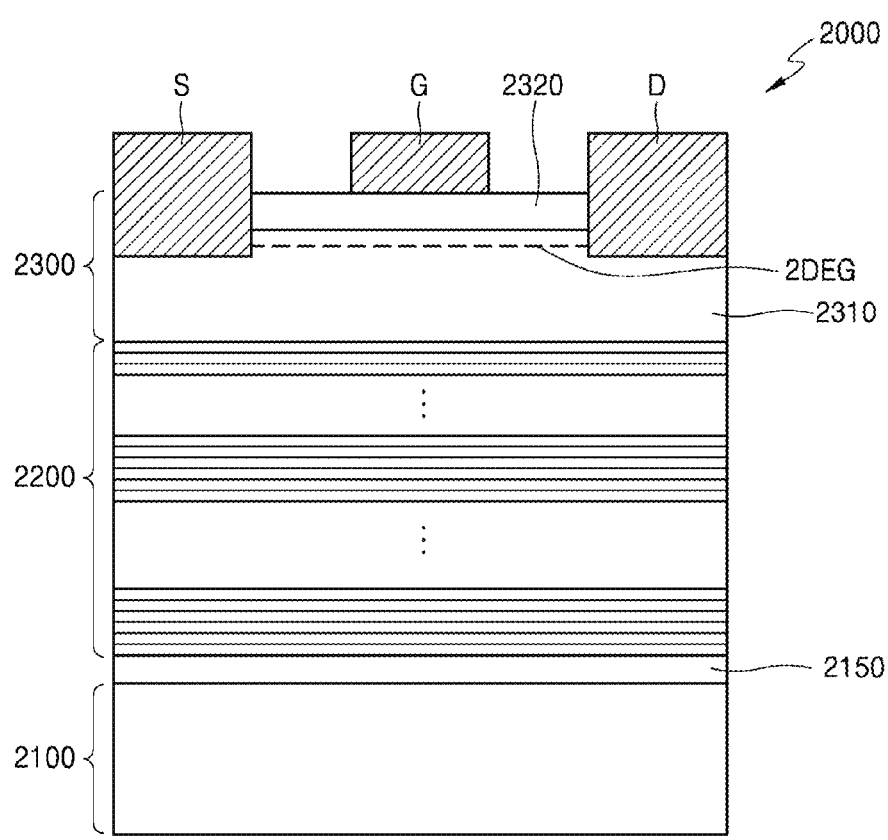
FIG. 14 is a schematic cross-sectional view of an electronic device according to some example embodiments.

FIG. 14 is a schematic cross-sectional view of an electronic device according to some example embodiments.

An electronic device 2000 includes a substrate 2100, a buffer layer 2200, and a semiconductor layer 2300. A gate electrode G is disposed on (e.g., directly or indirectly on) the semiconductor layer 2300. A source electrode S and a drain electrode D, which are in contact with separate, respective (e.g., opposite) sides of the semiconductor layer 2300 and are spaced apart from each other so as to be isolated from direct contact with each other, are disposed on (e.g., directly or indirectly on) the semiconductor layer 2300. A nucleation layer 2150 may be disposed between the substrate 2100 and the buffer layer 2200.

The substrate 2100 may be a sapphire substrate, a silicon (Si) substrate, or a silicon carbide (SiC) substrate. The substrate 2100 may be any other substrate that is different from the semiconductor layer 2300.

The buffer layer 2200 may mitigate defects due to a lattice constant difference and a thermal expansion coefficient difference between the semiconductor layer 2300 and the substrate 2100. The buffer layer 2200 may be any one of the aforementioned buffer layers according to various example embodiments of the present disclosure.

The nucleation layer 2150 may be disposed between the substrate 2100 and the buffer layer 2200. The nucleation layer 2150 may include AlN. An $Al_xGa_{1-x}N(0<x<1)$ layer (not shown) may be additionally formed between the nucleation layer 2150 and the buffer layer 2200.

The semiconductor layer 2300 may include a first semiconductor layer 2310 and a second semiconductor layer 2320.

The first semiconductor layer 2310 may include a Group III-V semiconductor. For example, the first semiconductor layer 2310 may include GaN, InN, GaAs, or the like. The first semiconductor layer 2310 may be an undoped layer or may be a layer doped with predetermined impurities.

The second semiconductor layer 2320 is formed on the first semiconductor layer 2310 and is formed of a material capable of inducing a two-dimensional electron gas layer 2DEG in the first semiconductor layer 2310. The second semiconductor layer 2320 may include a Group III-V semiconductor. For example, the second semiconductor layer 2320 may include AlGaN, AlInN, AlGaAs, or the like. Since AlGaN, AlInN, AlGaAs, or the like have a larger polarization rate than the first semiconductor layer 2310, 2DEG may be induced in the first semiconductor layer 2310. When the first semiconductor layer 2310 is a GaN layer, the second semiconductor layer 2320 may be an AlGaN layer or an AlInN layer. When the first semiconductor layer 2310 is an InN layer, the second semiconductor layer 2320 may be an AlInN layer. When the first semiconductor layer 2310 is a GaAs layer, the second semiconductor layer 2320 may be an AlGaAs layer. However, the materials of the first semiconductor layer 2310 and the second semiconductor layer 2320 presented herein are examples and may be variously changed. For example, the second semiconductor layer 2320 may have a multilayer structure including a plurality of different material layers.

The two-dimensional electron gas layer 2DEG formed on the first semiconductor layer 2310 by the second semiconductor layer 2320 may have a high electron concentration. Further, the electron concentration of the two-dimensional electron gas layer 2DEG formed on the first semiconductor layer 2310 may be further increased by performing a heat treatment process on the first semiconductor layer 2310.

The electronic device of FIG. 14 illustrates a basic structure of a high electron mobility transistor (HEMT) used as a power device, and this structure may be variously modified. For example, a gate insulating layer (not shown) or a depletion layer (not shown) may be further provided between the gate electrode G and the second semiconductor layer 2320. Further, a portion of the second semiconductor layer 2320, on which the gate electrode G is formed, is recessed to a predetermined depth to form a recess region (not shown), and then the gate electrode G may be formed in the recess region. In this case, characteristics of the two-dimensional electron gas layer 2DEG corresponding to the recess region may be changed, and characteristics of the HEMT may be adjusted. In addition, within the range in which the source electrode S and the drain electrode D are horizontally arranged, the structure may be modified into various structures.

Figure 15:
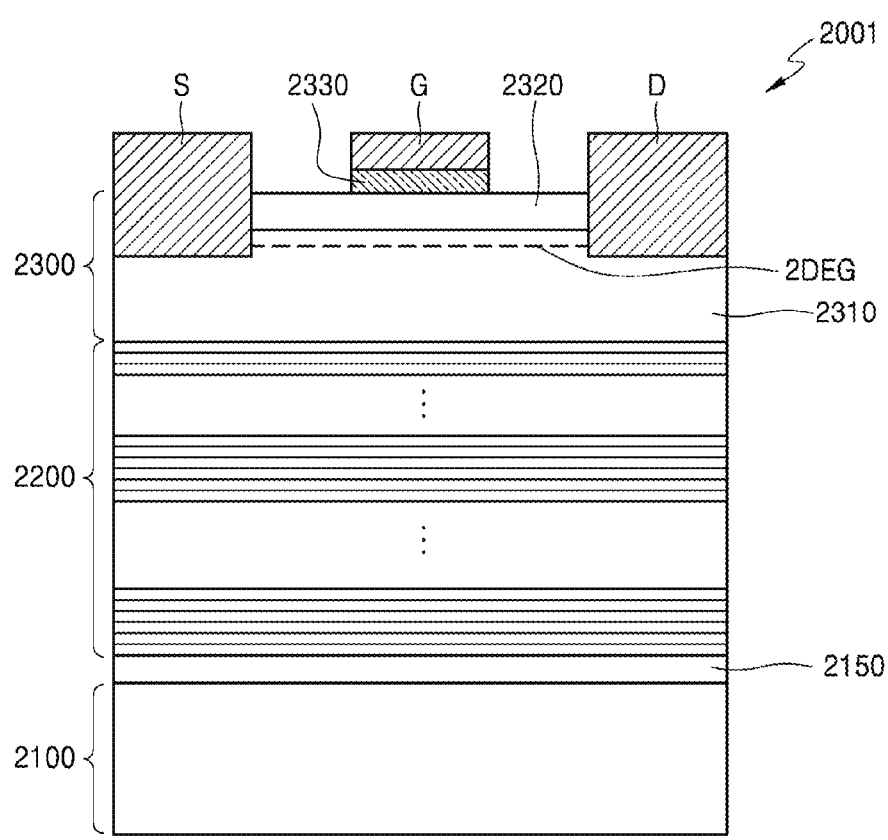
FIG. 15 is a schematic cross-sectional view of an electronic device according to some example embodiments.

FIG. 15 is a schematic cross-sectional view of an electronic device according to some example embodiments.

An electronic device 2001 of some example embodiments, which is a high electron mobility transistor (HEMT) of enhanced mode using p-GaN, is different from the electronic device 2000 of FIG. 14 in that a depletion layer 2330 is provided between (e.g., directly between as shown in FIG. 15 or indirectly between) the second semiconductor layer 2320 and the gate electrode G.

The depletion layer 2330 may be a semiconductor layer doped with p-type impurities. The depletion layer 2330 may be a p-type GaN layer. Mg may be used as the p-type impurities.

Since the aforementioned electronic device utilizes a buffer layer capable of securing the quality of a semiconductor layer, the electronic device may exhibit good electrical performance.

Although the aforementioned semiconductor thin film structure and the electronic device including the same have been described with reference to the example embodiments shown in the drawings, this is merely an example, and those skilled in the art will understand that various modifications and equivalent other embodiments are possible therefrom. It should be understood that embodiments described herein should be considered in a descriptive sense only and not for purposes of limitation. Therefore, the scope of the present disclosure should not be defined by the described embodiments, but should be determined by the technical spirit described in the following claims.

The aforementioned semiconductor thin film structure includes a buffer layer having a structure capable of reducing stress between a different kind of substrate and a semiconductor layer, thereby providing a semiconductor layer of good quality.

The aforementioned semiconductor thin film structure may be applied to various electronic devices such as a power device or a light emitting device.

Figure 16:
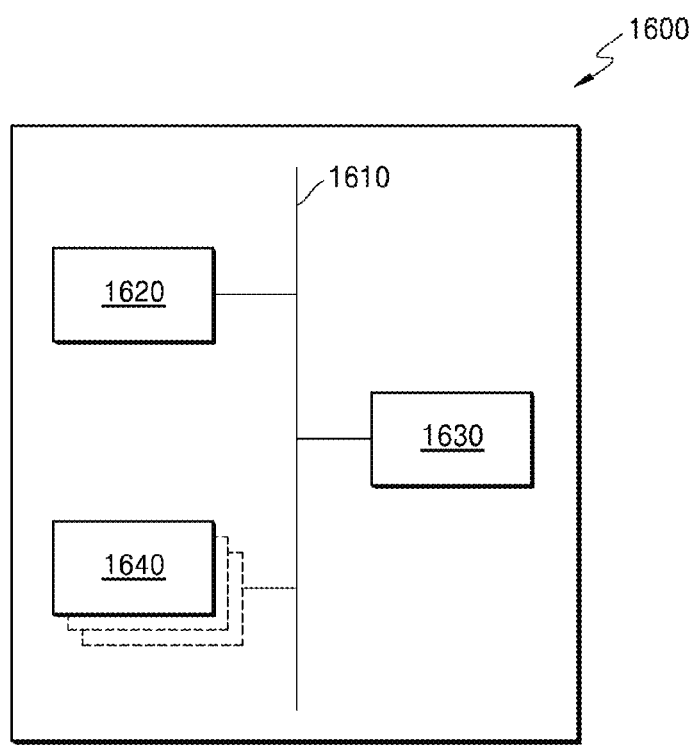
FIG. 16 shows a schematic of an electronic device according to some example embodiments.

FIG. 16 shows a schematic of an electronic device that may include the aforementioned semiconductor thin film structure according to some example embodiments.

As shown, the electronic device 1600 includes one or more electronic device components, including a processor (e.g., processing circuitry) 1620 and a memory 1630 that are communicatively coupled together via a bus 1610.

The processing circuitry 1620, may be included in, may include, and/or may be implemented by one or more instances of processing circuitry such as hardware including logic circuits, a hardware/software combination such as a processor executing software; or a combination thereof. For example, the processing circuitry 1620 may include, but is not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, the memory 1630 may include a non-transitory computer readable storage device, for example a solid state drive (SSD), storing a program of instructions, and the processing circuitry 1620 may be configured to execute the program of instructions to implement the functionality of the electronic device 1600.

In some example embodiments, the electronic device 1600 may include one or more additional components 1640, coupled to bus 1610, which may include, for example, a power supply, a light sensor, a light-emitting device, any combination thereof, or the like. In some example embodiments, one or more of the processing circuitry 1620, memory 1630, or one or more additional components 1640 may include any semiconductor thin film structure according to any of the example embodiments described herein, such that the one or more of the processing circuitry 1620, memory 1630, or one or more additional components 1640, and thus, the electronic device 1600, may have a semiconductor layer of good quality based on reduced stress between the semiconductor layer, thereby providing a semiconductor layer and a substrate (e.g., based on including any example embodiment of buffer layer as described herein) and thus providing an electronic device 1600 having improved electrical characteristics and thus improved performance and/or reliability.

It should be understood that example embodiments described herein should be considered in a descriptive sense only and not for purposes of limitation. Descriptions of features or aspects within each example embodiment should typically be considered as available for other similar features or aspects in other example embodiments. While one or more example embodiments have been described with reference to the figures, it will be understood by those of ordinary skill in the art that various changes in form and details may be made therein without departing from the spirit and scope as defined by the following claims.

What is claimed is:
1. A semiconductor thin film structure, comprising:
a substrate;
a buffer layer on the substrate, the buffer layer including
a plurality of unit layers, each unit layer of the plurality of unit layers including
a first layer having first bandgap energy and a first thickness,
a second layer having second bandgap energy and a second thickness, and
a third layer having third bandgap energy and a third thickness,
wherein one layer having a lowest bandgap energy of the first, second, and third layers of the unit layer is between two other layers of the first, second, and third layers of the unit layer,
wherein,
the first layer of the unit layer is proximate to the substrate in relation to the second layer and the third layer of the unit layer,
the third layer of the unit layer is distal to the substrate in relation to the first layer and the second layer of the unit layer,
the second thickness is smaller than the first thickness, and
the second thickness is smaller than the third thickness; and
a semiconductor layer on the buffer layer, such that the buffer layer is between the semiconductor layer and the substrate.
2. The semiconductor thin film structure of claim 1, wherein
the first layer is configured to adjust warpage of the substrate.
3. The semiconductor thin film structure of claim 1, wherein
the first bandgap energy is higher than the second bandgap energy, and
the first bandgap energy is lower than the third bandgap energy.
4. The semiconductor thin film structure of claim 1, wherein
the first thickness is greater than the second thickness, and
the first thickness is greater than the third thickness.
5. The semiconductor thin film structure of claim 1, wherein a sum of the first thickness and the second thickness is in a range of about 200% of the third thickness to about 1500% of the third thickness.

6. The semiconductor thin film structure of claim 5, wherein
the sum of the first thickness and the second thickness is in a range of about 400% of the third thickness to about 900% of the third thickness.

7. The semiconductor thin film structure of claim 1, wherein
the third layer is configured to at least partially inhibit a current flow in the buffer layer in a thickness direction of the buffer layer.

8. The semiconductor thin film structure of claim 1, wherein
a magnitude of a difference between the second bandgap energy and the third bandgap energy is equal to or greater than about 200% of a magnitude of a difference between the second bandgap energy and the first bandgap energy.

9. The semiconductor thin film structure of claim 1, wherein
the first layer includes $Al_wGa_{(1-w)}N(0<w\leq0.5)$.

10. The semiconductor thin film structure of claim 9, wherein
the second layer includes $Al_yGa_{(1-y)}N(0<y\leq0.1, y<w)$.

11. The semiconductor thin film structure of claim 10, wherein
the third layer includes $Al_xGa_{(1-x)}N_{(w<x\leq1)}$.

12. The semiconductor thin film structure of claim 11, wherein
the third layer includes $Al_xGa_{(1-x)}N(0.7\leq x\leq1)$.

13. The semiconductor thin film structure of claim 11, wherein
each unit layer further includes
a fourth layer on the third layer of the unit layer, the fourth layer having a fourth bandgap energy, the fourth bandgap energy having a variable magnitude in a thickness direction of the fourth layer, such that a magnitude of the fourth bandgap energy varies in the thickness direction of the fourth layer between a magnitude of the third bandgap energy and a magnitude of the first bandgap energy.

14. The semiconductor thin film structure of claim 13, wherein,
the fourth layer includes $Al_zGa_{(1-z)}N$,
z has a different value depending on a position of the fourth layer in a thickness direction of the buffer layer, and
an average value z(average) of the z value satisfies y<w<z(average)<x.

15. The semiconductor thin film structure of claim 11, wherein
each unit layer further includes
a fourth layer between the second layer of the unit layer and the third layer of the unit layer, the fourth layer having a fourth bandgap energy, the fourth bandgap energy having a variable magnitude in a thickness direction of the fourth layer, such that a magnitude of the fourth bandgap energy varies in the thickness direction of the fourth layer between a magnitude of the second bandgap energy and a magnitude of the third bandgap energy.

16. The semiconductor thin film structure of claim 15, wherein,
the fourth layer includes $Al_vGa_{(1-v)}N$, v has a different value depending on a position of the fourth layer in a thickness direction of the buffer layer, and
an average value v(average) of the v value satisfies y<w<v(average)<x.

17. The semiconductor thin film structure of claim 9, wherein
the second layer includes $In_yGa_{(1-y)}N(0\leq y\leq0.2)$, and
the third layer includes AlN.

18. The semiconductor thin film structure of claim 1, wherein
the first layer includes GaN.

19. The semiconductor thin film structure of claim 18, wherein
the second layer includes InGaN, and
the third layer includes AlN.

20. The semiconductor thin film structure of claim 1, wherein
each unit layer further includes
a fourth layer on the third layer of the unit layer, the fourth layer having a fourth bandgap energy, the fourth bandgap energy having a variable magnitude in a thickness direction of the fourth layer, such that a magnitude of the fourth bandgap energy varies in the thickness direction of the fourth layer between a magnitude of the third bandgap energy and a magnitude of the first bandgap energy.

21. The semiconductor thin film structure of claim 1, wherein each unit layer further includes
a fourth layer between the second layer of the unit layer and the third layer of the unit layer, the fourth layer having a fourth bandgap energy, the fourth bandgap energy having a variable magnitude in a thickness direction of the fourth layer, such that a magnitude of the fourth bandgap energy varies in the thickness direction of the fourth layer between a magnitude of the second bandgap energy and a magnitude of the third bandgap energy.

22. The semiconductor thin film structure of claim 1, wherein
each layer of the first layer, the second layer, and the third layer includes Al, In, Ga, and N, and includes a quaternary nitride having a different composition ratio.

23. A semiconductor thin film structure, comprising:
a substrate;
a buffer layer on the substrate, the buffer layer including
a plurality of unit layers, each unit layer of the plurality of unit layers including
a first layer having first bandgap energy and a first thickness,
a second layer having second bandgap energy and a second thickness, and
a third layer having third bandgap energy and a third thickness,
wherein one layer having a lowest bandgap energy of the first, second, and third layers of the unit layer is between two other layers of the first, second, and third layers of the unit layer; and
a semiconductor layer on the buffer layer, such that the buffer layer is between the semiconductor layer and the substrate,
wherein an average value of bandgap energy of layers included in each unit layer of the plurality of unit layers decreases in a direction from the substrate toward the semiconductor layer.

24. An electronic device, comprising:
the semiconductor thin film structure of claim 1;

a source electrode and a drain electrode which are in contact with separate, respective sides of the semiconductor layer and are isolated from direct contact with each other; and a gate electrode on the semiconductor layer.

25. The electronic device of claim 24, further comprising:

a depletion layer between the semiconductor layer and the gate electrode.

26. The electronic device of claim 25, wherein the depletion layer includes p-GaN.

* * * * *